(12) United States Patent
Hsieh et al.

(10) Patent No.: US 8,895,445 B2
(45) Date of Patent: Nov. 25, 2014

(54) METHOD OF FORMING VIA HOLES

(75) Inventors: Wen-Kuo Hsieh, Taipei (TW); Marowen Ng, Hsinchu (TW); Ming-Chung Liang, Hsinchu (TW); Hsin-Yi Tsai, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 547 days.

(21) Appl. No.: 13/228,108

(22) Filed: Sep. 8, 2011

(65) Prior Publication Data

US 2012/0149204 A1 Jun. 14, 2012

Related U.S. Application Data

(60) Provisional application No. 61/422,459, filed on Dec. 13, 2010.

(51) Int. Cl.
*H01L 21/311* (2006.01)
*H01L 21/768* (2006.01)

(52) U.S. Cl.
CPC ...... *H01L 21/31116* (2013.01); *H01L 21/7681* (2013.01); *H01L 21/76811* (2013.01); *H01L 21/76813* (2013.01); *H01L 21/76816* (2013.01); *H01L 21/76808* (2013.01); *H01L 21/31144* (2013.01); *H01L 21/31138* (2013.01)

USPC .......... 438/700; 438/638; 438/701; 438/717; 257/E21.249

(58) Field of Classification Search
USPC ......................................... 438/700
See application file for complete search history.

(56) References Cited

U.S. PATENT DOCUMENTS

| | | | |
|---|---|---|---|
| 2003/0067034 A1* | 4/2003 | Tsukanov et al. | 257/328 |
| 2006/0202341 A1* | 9/2006 | Ito | 257/758 |
| 2008/0299773 A1* | 12/2008 | Watanabe | 438/694 |

* cited by examiner

*Primary Examiner* — Angel Roman
(74) *Attorney, Agent, or Firm* — Lowe Hauptman & Ham, LLP

(57) ABSTRACT

A method for forming vias and trenches for an interconnect structure on a substrate includes exposing via pitch reduction patterns in a photoresist layer, developing the patterns to remove the via pitch reduction patterns, etching the photoresist layer partially using a polymer gas to reshape the pattern into small via shapes, and etching the remaining photoresist layer to extend the reshaped pattern. The reshaped small via shape patterns have a smaller pitch than the via pitch reduction patterns in a long direction. For via pitch reduction patterns having two vias each, the pattern has a peanut-shape. During the reshaping etch operation, the polymer gas deposits more in a pinched-in middle section while allowing downward etch in unpinched sections.

21 Claims, 7 Drawing Sheets

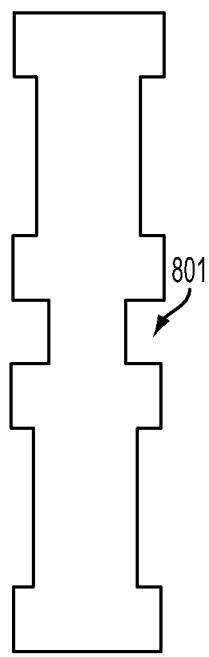 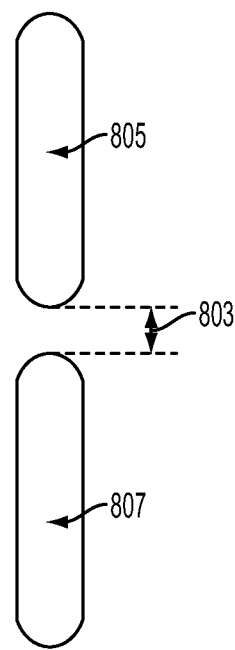
FIG. 8A  FIG. 8B
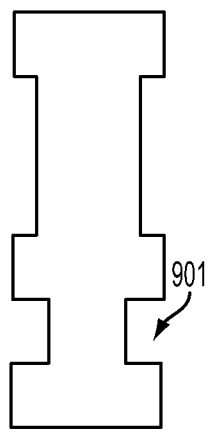 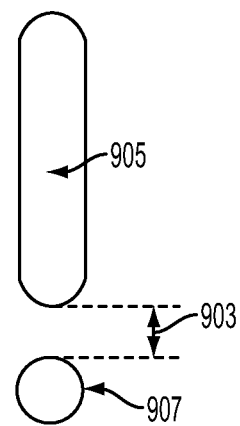
FIG. 9A  FIG. 9B

METHOD OF FORMING VIA HOLES

CROSS-REFERENCE TO RELATED APPLICATIONS

The present application claims priority of U.S. Provisional Patent Application Ser. No. 61/422,459, filed on Dec. 13, 2010, which is incorporated herein by reference in its entirety.

TECHNICAL FIELD

The present disclosure relates generally to a semiconductor manufacturing process, and more particularly, to a semiconductor process for forming vias and trenches for an interconnect structure.

BACKGROUND

In semiconductor fabrication processes, the photo resolution of a photoresist pattern begins to blur at about 45 nanometer (nm) half pitch, or about 90 nm pitch. As used in this disclosure, a pitch size in a pattern that can be formed using one mask without blurring is referred to as a single-mask pitch. As feature sizes decrease to 20/22 nm and beyond, various methods are used to address the resolution issue. Particularly, double exposure techniques may be used to reduce resolution using two masks.

Double exposure involves forming patterns on a single layer of a substrate using two different masks in succession. As a result, line spacing in the combined pattern can be reduced while maintaining good resolution. In a method referred to as double dipole lithography (DDL), the patterns to be formed on the layer are decomposed and formed on a first mask having only horizontal lines, and on a second mask having only vertical lines. The first and second masks are said to have 1-dimensional (1-D) patterns, which can be printed with existing lithographic tools.

Another form of double exposure is referred to as double patterning technology (DPT). Generally, a first pattern having a single mask pitch or greater is exposed, developed, and etched into the underlying dielectric layer before a second pattern that is different from the first pattern is exposed, developed, and etched into the underlying dielectric layer. The first and second patterns form an interlaced pattern in the underlying dielectric layer having features with pitch sizes as small as half of the single mask pitch. Thus, DPT generally allows for greater reduction in overall IC layout. However, DPT adds to manufacturing cost by using two layers of photoresist and doubling the number of operations to form the smaller pitch features.

While DPT methods can form features having small pitch size, they have not been entirely satisfactory in every aspect. More cost efficient methods continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 8A-8B illustrate an OPC pattern for two trenches and resulting trenches according to various method embodiments of the present disclosure.

FIGS. 9A-9B illustrate an OPC pattern including a pinched in portion and a resulting trench and via according to various method embodiments of the present disclosure.

DETAILED DESCRIPTION

Figure 1A:
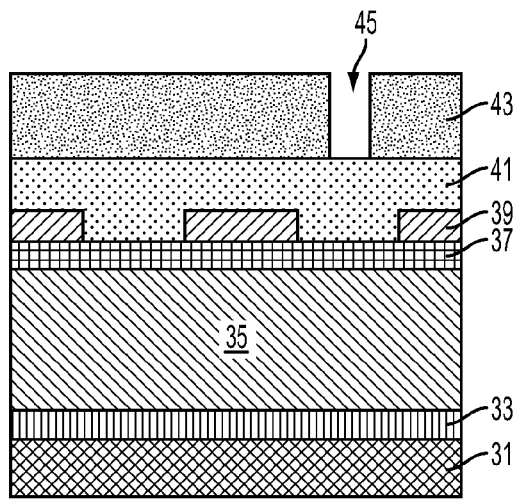
FIGS. 1A-1D illustrate cross-sectional views of one layer of interconnects at various stages of fabrication according to a double patterning technology.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed.

As critical dimensions continue to shrink, smaller features are placed closer together, especially around the device layers and in the first metal layer. A typical metal layer according to damascene processing is formed generally as follows. A dielectric layer is deposited on a substrate, which includes partially fabricated devices and/or circuitry. A pattern is then formed on the dielectric layer to define the metal features, which may includes both trenches and vias. The pattern is then used to etch the dielectric layer and in some places expose any metal contacts in the layer below. The typical etch process is an anisotropic dry etch followed by a wet clean. The pattern thus etched is then filled with a metal, typically copper, in several operations. A thin film of barrier/seed material is deposited in the etched pattern to prevent subsequent copper diffusion and to provide a seed layer for copper electroplating. Then copper is electroplated in the pattern to fill it. The copper not only fills the patterns, but also accumulates in the field area above the unpatterned portions of the dielectric layer. The substrate is then planarized using chemical mechanical polishing (CMP) to remove the copper from the field area to expose the dielectric layer.

A low k dielectric film may be combined with a double patterning technology in two pattern/two etch (2P2E) processing, described above to form dense metal features. In 2P2E processing, the dielectric layer is patterned and etched twice to form a pattern that cannot be resolved using one photomask. In other words, the pattern formed in a 2P2E process includes feature pitches smaller than the single-mask pitch as defined in this disclosure. A multiple layer photoresist is deposited over the dielectric layer, exposed, developed, and etched to form a first pattern in the dielectric layer, and removed before a second multiple layer photoresist is deposited for forming a second pattern in the dielectric layer. FIGS. 1A-1D illustrate the 2P2E processing in the context of interconnect formation.

Figure 1B:
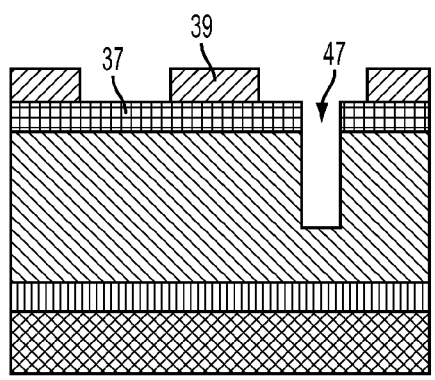

FIG. 1A illustrates forming the first pattern. A substrate 31 is below an etch stop layer 33, which is below a low k dielectric layer 35. An anti reflective layer 37 (ARL) and a patterned hard mask layer 39 are formed over the low k dielectric layer 35. A multiple layer photoresist of a first bottom anti reflection coating (BARC) 41 and a first photoresist layer 43 is deposited over the hard mask layer 39 and hence the dielectric layer 35. A portion 45 of photoresist 43 is exposed to radiation through a photomask which alters the chemical property of the photoresist in the exposed portion, rendering it susceptible to be dissolved by a developer chemical. In FIG. 1A, the portion 45 of photoresist layer 43 is exposed to the radiation, developed, and removed. The remaining portion of the photoresist layer is hardened. A first pattern is thus formed in the photoresist layer 43. The pattern 45 is then extended into the low k dielectric layer 35 by etching. As shown in FIG. 1B, the etching extends the opening 45 into the low k dielectric layer 35, forming a via 47. The etching condition is selected such that the material under the opening portion 45 of the photoresist layer 43 is preferentially etched over the hardened remaining portion of the photoresist layer 43. After the via 47 is formed, the BARC 41 and the remaining portion of the photoresist layer 43 are removed in a stripping process, resulting in the structure shown in FIG. 1B.

Figure 1C:
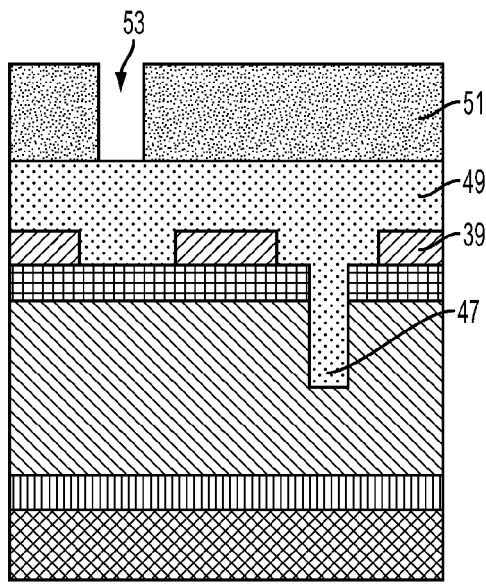

The patterning and etching operations in the 2P2E process are performed sequentially as PEPE. After the patterning and etching operations of FIGS. 1A and 1B, one more patterning and etching remain. FIG. 1C illustrates the second patterning. Another multiple layer photoresist of a second BARC 49 and a second photoresist layer 51 is deposited over the hard mask layer 39 and hence the dielectric layer 35, filling the previously formed via 47. A portion of photoresist is exposed to radiation through a photomask, which alters the chemical property of the photoresist, rendering it susceptible to be dissolved by a developer chemical. In FIG. 1C, the portion 53 of photoresist layer 51 is exposed to the radiation and removed after developing. A second pattern is thus formed in the photoresist. The pattern 53 is then extended into the low k dielectric layer 35 by etching.

The photoresist layer 51 and optionally the BARC 49 are then removed. As shown in FIG. 2D, further etching extends the openings 53 and 45 into the low k dielectric layer 35, now using the opening in the hardmask 39 as the pattern to form trench/via features 55 and 57, which extends through the etch stop layer 33. Any remaining BARC and photoresist are removed in a stripping process. After stripping, the substrate may be wet cleaned. While this discussion of the 2P2E process uses a two-layer photoresist of a BARC layer and a photoresist layer, fewer or more layers may be used. For example, some 2P2E processes may use a tri-layer photoresist including a photoresist layer, a middle layer of silicon rich material, and a bottom layer (BARC). Other 2P2E processes may include even higher number of layers in the photoresist.

As discussed, the 2P2E process requires deposition of an additional multi-layer photoresist, along with two sets of exposure and etching operations. The 2P2E process effectively doubles the manufacturing cost of one lithography step. The methods of pitch reduction for forming vias and trenches in this disclosure does not incur significant increase in the manufacturing from one lithography step to create features with pitch sizes much smaller than the single-mask pitch and may be used to form feature pitches as small as the 2P2E process.

In one aspect, the methods in accordance with various embodiments of the present disclosure involves exposing a plurality of peanut-shaped patterns in a photoresist layer, wherein the plurality of peanut-shaped patterns are arranged to have a pitch of X along a long side of the plurality of peanut-shaped patterns, developing the plurality of peanut-shaped patterns to remove the plurality of peanut-shaped patterns etching a middle layer below the photoresist layer using a polymer gas, etching a bottom layer below the middle layer to form two openings in the bottom layer for every peanut-shaped pattern, said openings in the bottom layer have a pitch of X/2, and etching a dielectric layer below the bottom layer to form via holes having a pitch of X/2. This method uses a tri-layer photoresist that includes a top photoresist layer, a middle layer, and a bottom layer. A minimum value of X is defined by a minimum spacing of the exposure operation, or, in other words, the single-mask pitch. The polymer gas may be $C_4F_8$, $C_3F_6$, $C_4F_6$, $C_3F_8$, $C_5F_8$, $CHF_3$, $CH_2F_2$, $CH_3F$, or a combination of these. The polymer gas may also be other halogenated carbon polymers having a carbon chain of four or more carbons. During the etching a middle layer operation, the polymer gas deposits a polymer in a pinched-in middle section of each of the plurality of peanut-shaped patterns. The etching a middle layer section also uses a etching gas and a carrier gas, which include $CF_4$.

In another aspect, the methods in accordance with various embodiments of the present disclosure involves forming via holes by exposing one or more via pitch reduction patterns in a photoresist layer, wherein the one or more via pitch reduction patterns have a width W and length Y and are pinched-in at a plurality of pinched-in points along the length Y of the one or more via pitch reduction patterns, said pinched-in points are separated from each other by a distance Z, developing the one or more via pitch reduction patterns to remove the one or more via pitch reduction patterns, etching a middle layer below the photoresist layer using a polymer gas, etching a bottom layer below the middle layer to form a plurality of openings in the bottom layer, said openings in the bottom layer have a pitch of Z, etching a dielectric layer below the bottom layer to form via holes having a pitch of Z, wherein the pitch of Z is smaller than a minimum spacing of the exposing operation.

In certain embodiments, the peanut shaped patterns or the via pitch reduction patterns are generated using optical proximity correction (OPC) techniques. The middle layer of the tri-layer photoresist may be a silicon rich layer, which may be an anti-reflective layer. The dielectric layer may be a low-k dielectric layer or an ultra-low k dielectric layer. The method may further include etching a trench over the via holes while further extending the via holes to break through an etch stop layer.

Figure 2:
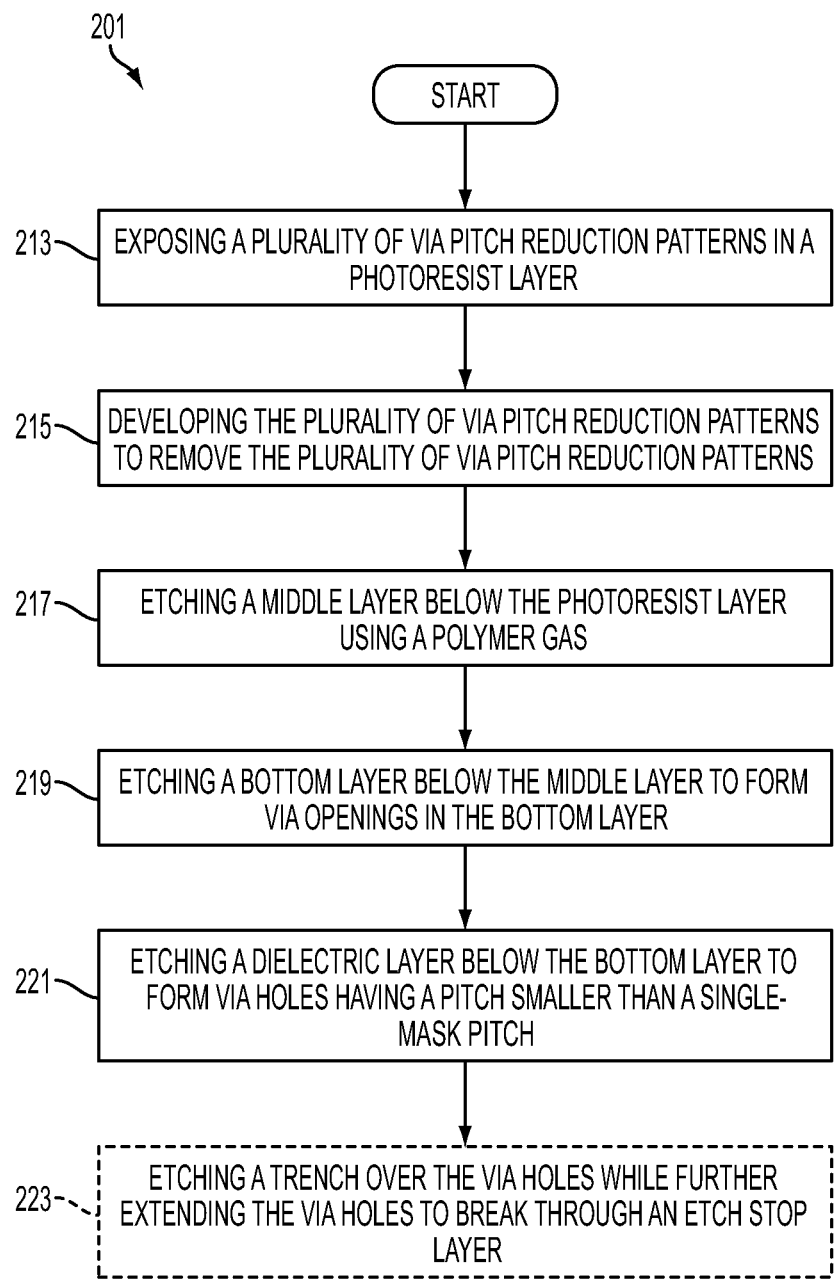
FIG. 2 is a flowchart illustrating a method of forming vias and trenches for an interconnect structure according to various embodiments of the present disclosure.
Figure 3A:
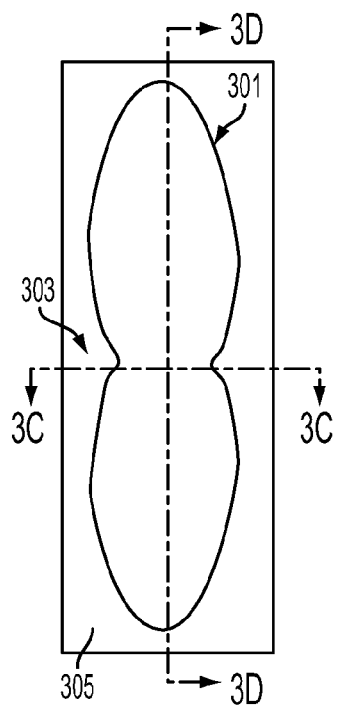
FIGS. 3A-3D illustrate the photoresist pattern in a top view (3A), a scanning electron microscope (SEM) photograph (3B), and 2 side views (3C and 3D) during an intermediate stage according to various method embodiments of the present disclosure.
Figure 3B:
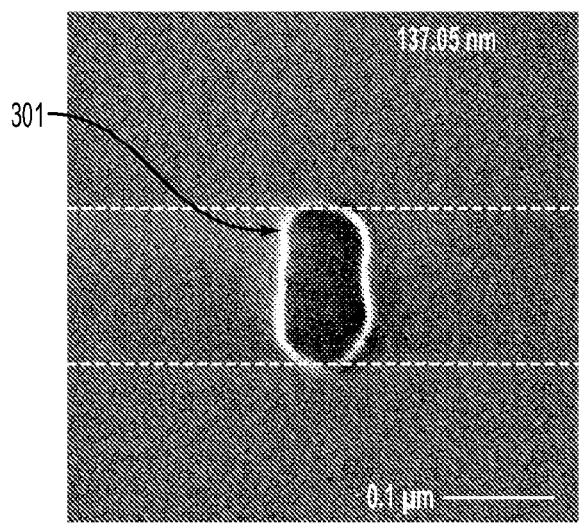
Figure 3C:
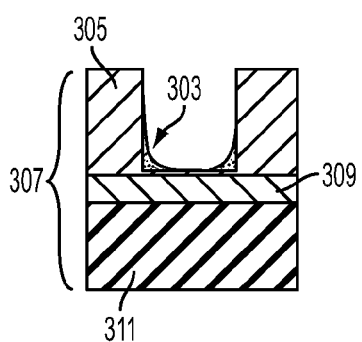

FIG. 2 illustrates a process flow 201 in accordance with various embodiments of the present disclosure. In operation 213, a plurality of via pitch reduction patterns is exposed in a photoresist layer. The photoresist layer is a top layer in a multi-layer photoresist formed over a dielectric layer on partially fabricated semiconductor wafer having other layers thereon. The via pitch reduction pattern may be a peanut-shaped pattern or a multiple-pod pattern of many connected peanut-shaped patterns. FIG. 3A shows an example peanut shaped pattern 301 exposed in a photoresist layer. The peanut-shaped pattern is a roughly oval section with a pinched-in middle section 303. In other words, it is a multiple-pod pattern having two pods. FIG. 3C shows the tri-layer photoresist 307 having a photoresist layer 305, a middle layer 309, and a bottom layer 311.

Figure 3D:
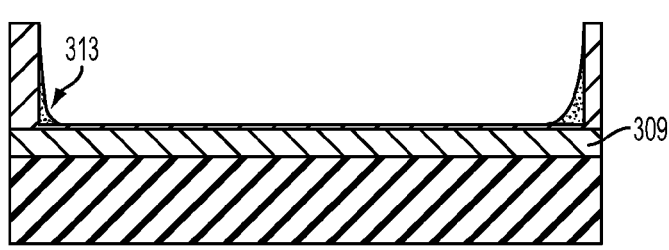

In operation 215 of FIG. 2, the plurality of via pitch reduction patterns are developed to removed the via pitch reduction patterns. The developing operation is a typical lithography operation where the photoresist layer is exposed a developer, which dissolves a portion of the photoresist layer or otherwise render it easily removed. FIGS. 3C and 3D show cross sections of the photoresist layer 305 after the developing operation 215. FIG. 3C shows a cross section along 3C of FIG. 3A from the pinched-in middle section. The pinched-in portion 303 is formed of undeveloped photoresist material in the bottom corners of the cross section view in FIG. 3C. FIG. 3D shows a lengthwise cross section along 3D of FIG. 3A through the center of the peanut-shaped pattern 301. The 3D shows no undeveloped photoresist material in the center of the pattern. However, some residue 313 may be found in the narrow ends of the oval. FIG. 3B shows an SEM photograph of the top of the photoresist after exposing and developing a peanut-shaped pattern. A narrowing in the middle of the pattern 301 can be readily discerned.

Referring back to FIG. 2, in operation 217 a middle layer below the photoresist layer is etched using a polymer gas. The middle layer etch operation may be also referred to as a break-through etch. An RF etch using both high frequency (HF) and low frequency (LF) bias may be used. The HF power may be about 500 to 1000 watts, for example, at about 750 watts, and controls the ionization of the various etching gases, including at least a polymer gas and typically an etching gas such as $CF_4$. The LF power controls the physical etching and may be about 200 watts. The process both deposits and etches the middle layer during the operation. The overall ratio of etching to depositing is controlled by the different gas flow rates and RF power. The ratio of etching to depositing also varies locally. The different surface areas at the pinched-in portion and the other sidewall portions cause a different etch/deposition rate at these locations. Because the surface area at the pinched-in portion is larger, more polymer is deposited there than other sidewall portions, translating to a slower etch at that region. At the same time, the etching in other regions progresses deeper through the middle layer and the bottom layer.

Table 1 shows various processing conditions that may be suitable for the middle layer etch. Generally, an increase in the HF power would increase the ionization in the plasma. An increase in the LF power or the $C_4F_8$ flow would increase the bias toward the wafer, so as to cause more anisotropic etch. An increase in the $CF_4$ flow would decrease the etch rate and increase the deposition at high surface area regions. The polymer gas may be $C_4F_8$, $C_3F_6$, $C_4F_6$, $C_3F_8$, $C_5F_8$, $CHF_3$, $CH_2F_2$, $CH_3F$, or a combination of these. The polymer gas may also be other halogenated carbon polymers having a carbon chain of four or more carbons. The polymer gas flow rate depends on the gas used and the RF power, suitable flow rate may be about 10 to 100 sccm, for example, 20 sccm. An important factor not shown here is the thickness of the middle layer, which can vary from about 20 nm to 60 nm.

TABLE 1

|  | Suitable range |
| --- | --- |
| Pressure (mT) | 30-200 |
| HF power (watts) | 50-1000 |
| LF power (watts) | 50-1000 |
| $CF_4$ (sccm) | 5-50 |
| Polymer gas (sccm) | 5-50 |
| $N_2$ (sccm) | 10-100 |

Next, in operation 219, the bottom layer below the middle layer is etched to form via openings in the bottom layer. This etch operation is also referred to as the dry develop operation. An RF etch using high frequency (HF) and low frequency (LF) bias (optional) may be used. The HF power may be about 500 to 1000 watts, for example, at about 750 watts. The LF power may be off or set at a low power. The etch continues to create holes in the bottom layer according to the middle layer etch. In some embodiments, the bottom layer etch may be performed in the same etch chamber as the middle layer etch by simply changing process conditions. Suitable etchant gas includes $CO_2$, $CF_4$, $CH_2F_2$, $CHF_3$, $C_4F_8$, $N_2$, and $H_2$.

TABLE 2

|  | Suitable range |
| --- | --- |
| Pressure (mT) | 30-200 |
| HF power (watts) | 50-1000 |
| LF power (watts) | 50-1000 |
| Etchant gas, ex. $CO_2$ (sccm) | 100-500 |

Figure 4A:
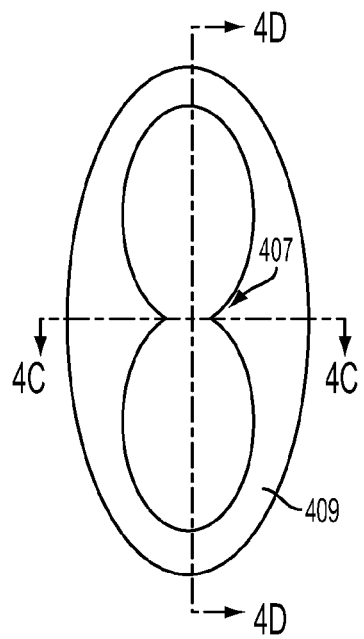
FIGS. 4A-4D illustrate the photoresist pattern in a top view (4A), an SEM photograph (4B), and 2 side views (4C and 4D) during an intermediate stage according to various method embodiments of the present disclosure.
Figure 4B:
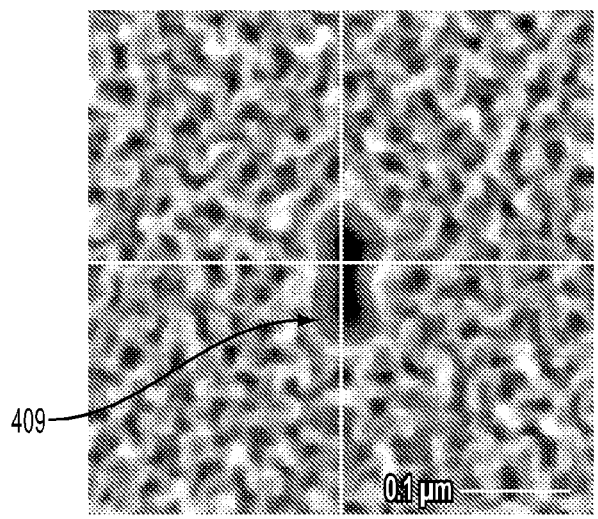
Figure 4C:
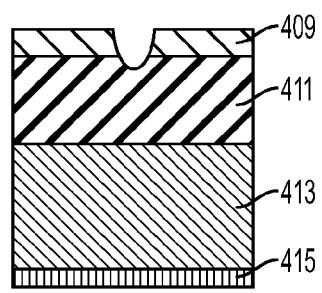
Figure 4D:
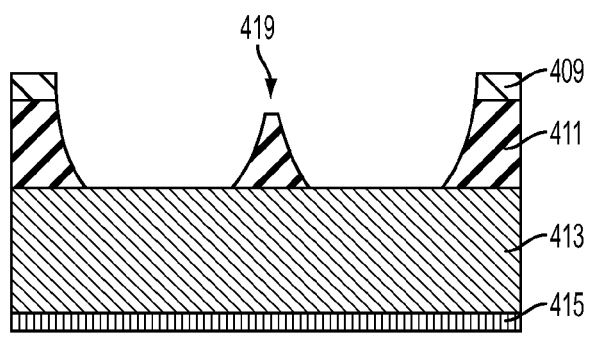

FIG. 4A shows the top view of the middle layer 409 after the etching operations, showing the pinched-in portion 407 has narrowed along line 4C. FIGS. 4C and 4D show cross sections of various layers 409 to 415 along 4C and 4D of FIG. 4A after the etching a middle layer operation 217. An etch stop layer 415 is disposed below a dielectric layer 413, which is disposed below the tri-layer photoresist. FIG. 4C shows a cross section along 4C of FIG. 4A through the pinched-in middle section. The pinched-in portion 407 is only etched in the middle layer 409 and very little of the bottom layer 411 is removed. FIG. 4D shows a lengthwise cross section along 4D of FIG. 4A through the center of the peanut-shaped pattern. FIG. 4D shows that the middle layer 409 is completely etched through, but a center portion 419 of the bottom layer 411 remains, resulting in two via openings on either side of the center portion 419. This center portion 419 of the bottom layer 411 is a result of the slower etching at the pinched-in portion 407. FIG. 4B shows an SEM photograph of the top of the middle layer after etching the middle layer. The narrowing in the middle of the pattern is much more pronounced than that of FIG. 3B. Because the photograph is taken of the top of the middle layer, the closing of the pinched-in portion in the bottom layer is not shown.

Referring back to FIG. 2 at operation 221, a dielectric layer below the bottom layer is etched to form via holes having a smaller pitch than the single-mask pitch. In some embodiments, the dielectric etch operation is a continuation of the bottom layer etch operation in the same chamber. The process conditions during the dielectric etch may be different than the bottom layer etch. In other embodiments, the semiconductor substrate is removed from the etch chamber and heated to harden the remaining multi-layer photoresist before operation 221. In certain embodiments, this dielectric etch operation is an anisotropic etch that extends the via opening in the bottom layer formed in operation 219 into the dielectric layer below. A typical anisotropic etch includes RF bias to direct the etchant downwards toward the dielectric layer and may use argon, nitrogen, oxygen, carbon monoxide, carbon dioxide as ionized etchants.

Figure 5A:
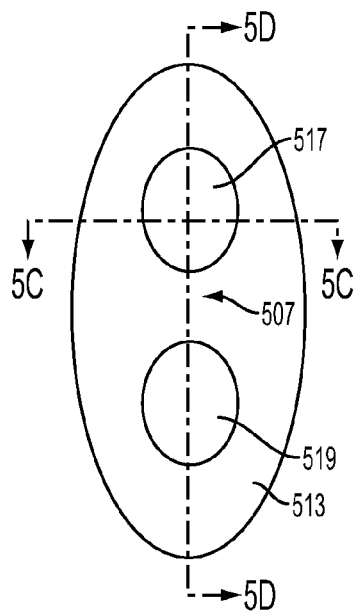
FIGS. 5A-5D illustrate the via patterns in a dielectric layer in a top view (5A), an SEM photograph (5B), and 2 side views (5C and 5D) according to various method embodiments of the present disclosure.
Figure 5B:
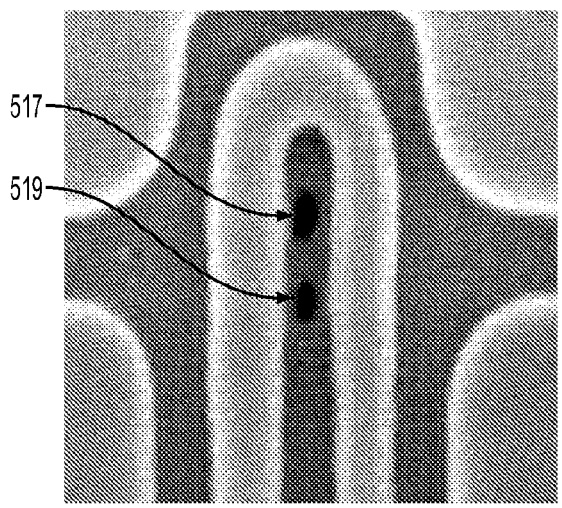

FIG. 5A to 5D show various views after the dielectric layer is etched and the multi-layer photoresist removed. FIG. 5A shows a top view from the top of the dielectric layer 513. Note that the center portion 507 is completely closed here. Two vias 517 and 519 are etched in the dielectric layer 513. The size of the vias 517 and 519 may be controlled by the process conditions during the operation 211. For example, adding a chemical etching gas may increase the diameter of the vias. FIG. 5B is an SEM photograph showing two via holes from an implementation of the embodiments of the present disclosure. FIG. 5B shows the dielectric layer from the implementation of FIGS. 3B and 4B, and thus demonstrates that the methods of the present disclosure are effective for producing via holes.

Figure 5C:
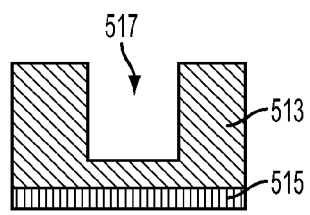
Figure 5D:
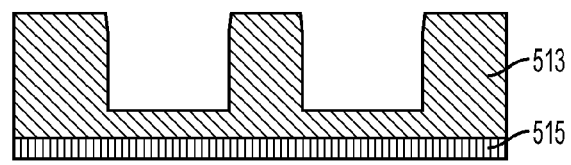

FIG. 5C shows a cross section view along 5C of FIG. 5A at the via 517. FIG. 5D shows a cross section view along 5D of FIG. 5A with both vias 517 and 519. Note that the vias 517 and 519 are shown not penetrating the dielectric layer 513 and the etch stop layer 515. In some embodiments, the dielectric etch stops before penetrating the dielectric layer because the vias are subsequently etched again to extend to a contact metal feature below the etch stop layer 515, for example, with a trench etch. In other embodiments, the vias need not contact a metal because they are used as dummy vias. When deposited with metal along with other vias, dummy vias can reduce local effects during chemical mechanical polishing (CMP). In still other embodiments, the dielectric etch continues until a contact metal below the dielectric layer is exposed. In these embodiments, the etch stop layer may not be used.

Figure 1D:
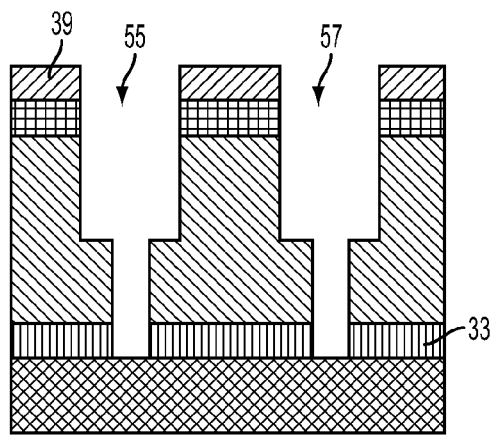

Referring back to FIG. 2, in optional operation 223 a trench may be etched over the via holes while further extending the via holes to break through an etch stop layer below the dielectric layer. A previously deposited trench mask may be exposed after the multi-layer photoresist is removed. Using the trench mask, further etching would extend the vias while forming a trench, as shown in FIG. 1D.

After the trenches and vias are formed in the dielectric layer, the damascene process continues to form the interconnect structure. The trenches and vias are filled with a metal, usually copper. If copper is deposited using a electroplating process, then it is usually planarized in a chemical mechanical polishing (CMP) process. After a metal layer is formed, the process is repeated for subsequent metal layers until the interconnect structure is complete.

Figure 6A:
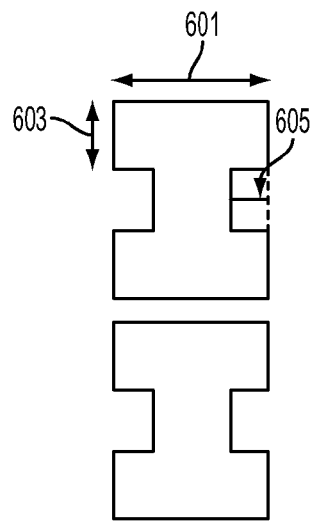
FIGS. 6A-6C illustrates an optical proximity correction (OPC) pattern, the resulting peanut-shaped pattern in a photoresist layer, and the via pattern in the dielectric layer after etching according to various method embodiments of the present disclosure.
Figure 6B:
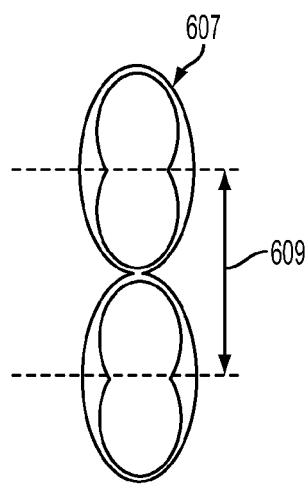
Figure 6C:
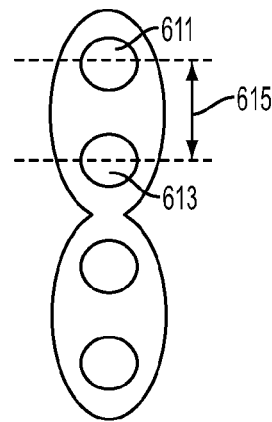

FIGS. 6A to 6C illustrate a pitch reduction in accordance with various embodiments of the present disclosure. FIG. 6A shows an optical proximity correction (OPC) pattern used to form two peanut-shaped patterns. As discussed above, peanut-shaped patterns are a type of via pitch reduction patterns. FIG. 6B shows the resulting peanut-shaped pattern in a photoresist layer. FIG. 6C shows the via pattern in the dielectric layer after etching. The OPC pattern of FIG. 6A has a larger width dimension 601, a head size dimension 603, and a pinched-in dimension 605. All of these dimensions may be adjusted to form a desired pattern 607 as shown in FIG. 6B. Multiple patterns 607 are formed with a pitch 609, also sometimes referred herein has having a value of X. By forming two vias 611 and 613 in the dielectric layer per pattern 607, the pitch between features becomes 615, which can have a value a little as X/2, depending on the spacing between the patterns 609. As illustrated in FIGS. 6A to 6C, two patterns may be used to form 4 vias. The via pitch 615 is smaller than the pattern pitch 609. In other words, the resulting vias have a pitch that is smaller than the original pattern pitch.

In one example, vias were etched according to various embodiments of the present disclosure and demonstrated to have a pitch of 56 nm as measured by a transmission electron microscope (TEM). This pitch of 56 nm is smaller than the single-mask pitch of 84 nm. It is believed that even smaller pitch can be achieved by fine tuning the various etch process conditions and the OPC pattern.

Figure 7A:
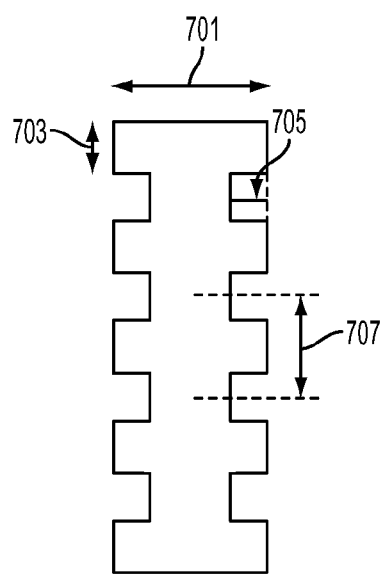
FIGS. 7A-7C illustrates an optical proximity correction (OPC) pattern, the resulting via pitch reduction pattern in a photoresist layer, and the via pattern in the dielectric layer after etching according to various method embodiments of the present disclosure.
Figure 7B:
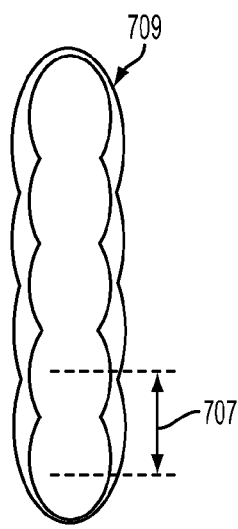
Figure 7C:
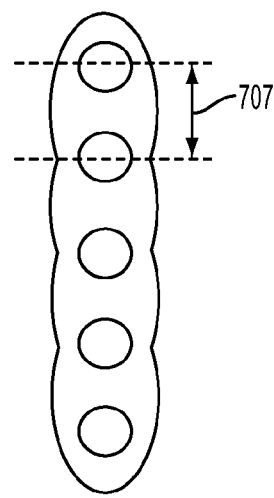

FIGS. 7A to 7C illustrate another pitch reduction embodiment in accordance with various methods of the present disclosure. FIG. 7A shows an optical proximity correction (OPC) pattern used to form a via pitch reduction pattern. FIG. 7B shows the resulting via pitch reduction pattern in a photoresist layer in a multiple-pod pattern. FIG. 7C shows the via pattern in the dielectric layer after etching. The OPC pattern of FIG. 7A has a larger width dimension 701, a head size dimension 703, a pinched-in dimension 705, and a pinched-in portion pitch 707. The via pitch reduction pattern includes four pinched-in portions. All of these dimensions may be adjusted to form a desired pattern 709 as shown in FIG. 7B. The via pitch reduction pattern 709 is also referred to as a multiple-pod pattern. The pitch between the pods is the same as the pinched-in portion pitch 707. The pod pitch is also the same as via pitch in the dielectric layer as formed in FIG. 7C. Because one multiple pod pattern forms many vias, the resulting via pitch is always smaller than the pattern pitch. According to this embodiment, patterns with any number of vias may be formed by adjusting the number of pinched-in portions in the OPC pattern. The via pitch is then determined by the pinched-in portion pitch, not the single-mask pitch for the lithography process.

In other embodiments, the methods of this disclosure are applied to forming multiple trenches close to each other and/or to forming trenches and vias close to each other at the same time. The method is used to form any two features close to each other with a certain geometry, for example, two trenches end on end, a trench with a via at the end and two trenches at right angles to each other and intersecting one of the trenches.

These other embodiments are described using the concept of minimum spacing. The single-mask pitch includes a pattern size and a spacing between adjacent patterns. The lithographic limitation of about 84 nm has a pattern size part and a spacing part. A minimum spacing is a lithographically defined minimum distance between certain parts of patterns. The minimum spacings between different parts of patterns have different values. For two trenches, for example, the minimum spacing value for the end of one trench to the adjacent end of the next trench is different from the minimum spacing value for the side of one trench to the adjacent side of the next trench.

In order to form two trenches end to end, the OPC pattern for two trenches may be joined as shown in FIG. 8A, with a pinched-in portion 801 in between. Using the process disclosed, etching into the dielectric layer may result in two trenches as shown in FIG. 8B, trenches 805 and 807, with a spacing 803 between them. Using a pinched-in portion and the etch process disclosed herein to separate the trenches, the spacing 803 may be less than the minimum spacing between two trenches end to end for the lithographic process.

In another embodiment, a trench and a via are formed, the via at the end of the trench. FIG. 9A shows an OPC pattern that includes a pinched in portion 901 between a trench pattern and an via pattern. As shown in FIG. 9B, the resulting trench 905 and via 907 may have a spacing 903 smaller than the minimum spacing.

The foregoing has outlined features of several embodiments so that those skilled in the art may better understand the detailed description above. Those skilled in the art should appreciate that they may readily use the present disclosure as a basis for designing or modifying other processes and structures for carrying out the same purposes and/or achieving the same advantages of the embodiments introduced herein. For example, various types of pattern combinations and features may be combined as disclosed to reduce feature spacing and pitch without the expense of double patterning technologies. It is understood, however, that these advantages are not meant to be limiting, and that other embodiments may offer other advantages. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming via holes, said method comprising:
   exposing a plurality of peanut-shaped patterns in a photoresist layer, wherein the plurality of peanut-shaped patterns are arranged to have a pitch of X along a long side of the plurality of peanut-shaped patterns;
   developing the plurality of peanut-shaped patterns to remove a photoresist material in the plurality of peanut-shaped patterns;
   etching a middle layer below the photoresist layer using a polymer gas;
   etching a bottom layer below the middle layer to form two openings in the bottom layer for every peanut-shaped pattern, said openings in the bottom layer having a pitch of X/2; and
   etching a dielectric layer below the bottom layer to form via holes having a pitch of X/2.

2. The method of claim 1, wherein a minimum value of X is defined by a minimum spacing of the exposure operation.

3. The method of claim 1, wherein the polymer gas comprises $C_4F_8$.

4. The method of claim 1, wherein the polymer gas comprises $C_4F_8$, $C_3F_6$, $C_4F_6$, $C_3F_8$, $C_5F_8$, $CHF_3$, $CH_2F_2$, $CH_3F$, or a combination of these.

5. The method of claim 1, wherein the polymer gas comprises a halogenated carbon polymer having a four or more carbon chain.

6. The method of claim 1, wherein the polymer gas deposits a polymer during the etching a middle layer to slow etching of a pinched-in middle section of each of the plurality of peanut-shaped patterns.

7. The method of claim 1, wherein the etching a middle layer operation further uses an etching gas and a carrier gas.

8. The method of claim 7, wherein the etching gas is $CF_4$.

9. The method of claim 1, wherein the peanut-shaped patterns are rectangles with pinched-in middle section.

10. The method of claim 9, wherein said peanut-shaped patterns are generated using optical proximity correction (OPC) techniques.

11. The method of claim 1, wherein the dielectric layer is a low k dielectric layer.

12. The method of claim 1, wherein the middle layer is a silicon rich layer.

13. The method of claim 1, further comprising etching a trench over the via holes while further extending the via holes to break through an etch stop layer.

14. A method of forming via holes, said method comprising:
   exposing one or more via pitch reduction patterns in a photoresist layer, wherein the one or more via pitch reduction patterns have a width and length Y and are pinched-in at a plurality of pinched-in points along the length Y of the one or more via pitch reduction patterns, said pinched-in points are separated from each other by a distance Z;
   developing the one or more via pitch reduction patterns to remove a photoresist material in the one or more via pitch reduction patterns;
   etching a middle layer below the photoresist layer using a polymer gas;
   etching a bottom layer below the middle layer to form a plurality of openings in the bottom layer, said openings in the bottom layer having a pitch of Z; and
   etching a dielectric layer below the bottom layer to form via holes having a pitch of Z,
   wherein the pitch of Z is smaller than a minimum spacing of the exposing operation.

15. The method of claim 14, wherein the polymer gas comprises $C_4F_8$.

16. The method of claim 14, wherein the polymer gas comprises $C_4F_8$, $C_3F_6$, $C_4F_6$, $C_3F_8$, $C_5F_8$, $CHF_3$, $CH_2F_2$, $CH_3F$, or a combination of these.

17. The method of claim 14, wherein the polymer gas comprises a halogenated carbon polymer having a four or more carbon chain.

18. The method of claim 14, wherein the polymer gas deposits a polymer during the etching a middle layer to slow etching of surfaces proximate to the plurality of pinched-in points.

19. The method of claim 14, wherein the one or more via pitch reduction patterns are generated using optical proximity correction (OPC) techniques.

20. The method of claim 14, further comprising etching a trench over the via holes while further extending the via holes to break through an etch stop layer.

21. A method of forming via holes, said method comprising:
   exposing a plurality of peanut-shaped patterns in a photoresist layer, wherein the plurality of peanut-shaped patterns are arranged to have a pitch of X along a long side of the plurality of peanut-shaped patterns;
   developing the plurality of peanut-shaped patterns to remove a photoresist material in the plurality of peanut-shaped patterns;
   etching a middle layer below the photoresist layer using a first polymer gas;
   etching a bottom layer below the middle layer using a second polymer gas different from the first polymer gas to form two openings in the bottom layer for every peanut-shaped pattern, said openings in the bottom layer having a pitch of X/2; and
   etching a dielectric layer below the bottom layer to form via holes having a pitch of X/2.

* * * * *